(12) United States Patent
Tseng et al.

(10) Patent No.: US 11,769,857 B2
(45) Date of Patent: Sep. 26, 2023

(54) MICRO LIGHT-EMITTING DEVICE

(71) Applicant: PlayNitride Display Co., Ltd., MiaoLi County (TW)

(72) Inventors: Yen-Chun Tseng, MiaoLi County (TW); Tzu-Yang Lin, MiaoLi County (TW); Jyun-De Wu, MiaoLi County (TW); Yi-Chun Shih, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 91 days.

(21) Appl. No.: 17/120,289

(22) Filed: Dec. 14, 2020

(65) Prior Publication Data

US 2022/0131032 A1  Apr. 28, 2022

(30) Foreign Application Priority Data

Oct. 26, 2020  (TW) .................................. 109137130

(51) Int. Cl.
  *H01L 33/10* (2010.01)
  *H01L 33/24* (2010.01)
  *H01L 33/36* (2010.01)

(52) U.S. Cl.
  CPC .............. *H01L 33/10* (2013.01); *H01L 33/24* (2013.01); *H01L 33/36* (2013.01)

(58) Field of Classification Search
  CPC ....... H01L 33/10; H01L 33/145; H01L 33/24; H01L 33/36; H01L 33/382
  See application file for complete search history.

(56) References Cited

U.S. PATENT DOCUMENTS

2002/0145147 A1  10/2002  Chiou et al.
2003/0048822 A1  3/2003  Nakatsu et al.
(Continued)

FOREIGN PATENT DOCUMENTS

CN  102891230  1/2013
CN  104576859  4/2015
(Continued)

OTHER PUBLICATIONS

"Office Action of Taiwan Counterpart Application", dated Mar. 8, 2022, p. 1-p. 11.
(Continued)

*Primary Examiner* — Matthew C Landau
*Assistant Examiner* — Dmitriy Yemelyanov
(74) *Attorney, Agent, or Firm* — JCIPRNET (57) ABSTRACT

A micro light-emitting device, including a first type semiconductor layer, a light-emitting layer, a second type semiconductor layer, a first type electrode, a second type electrode, and a light reflection layer, is provided. The light-emitting layer is arranged on the first type semiconductor layer. The second type semiconductor layer is arranged on the light-emitting layer. The first type electrode and the second type electrode are both arranged on the second type semiconductor layer. The light reflection layer is arranged between the light-emitting layer and the first type electrode. The light reflection layer includes an oxidized area and a non-oxidized area. A reflectance of the oxidized area is greater than a reflectance of the non-oxidized area. An orthographic projection of a part of the oxidized area on the first type semiconductor layer and an orthographic projection of the first type electrode on the first type semiconductor layer at least partially overlap.

19 Claims, 6 Drawing Sheets

(56) References Cited

U.S. PATENT DOCUMENTS

2005/0271106 A1* 12/2005 Watanabe .......... H01S 5/18388
                                                    372/43.01
2010/0208760 A1*  8/2010 Yoshikawa .......... H01S 5/1833
                                                    372/44.01
2019/0237630 A1*  8/2019 Check .................... H01L 33/46

FOREIGN PATENT DOCUMENTS

| | | |
|---|---|---|
| CN | 208637452 | 3/2019 |
| CN | 111788702 | 10/2020 |
| JP | 2005311072 | 11/2005 |
| JP | 2006100420 | 4/2006 |
| TW | 201036295 | 10/2010 |

OTHER PUBLICATIONS

"Office Action of China Counterpart Application", dated Dec. 5, 2022, p. 1-p. 8.
"Office Action of China Counterpart Application", dated Jun. 7, 2023, p. 1-p. 5.

\* cited by examiner

MICRO LIGHT-EMITTING DEVICE

CROSS-REFERENCE TO RELATED APPLICATION

This application claims the priority benefit of Taiwan application serial no. 109137130, filed on Oct. 26, 2020. The entirety of the above-mentioned patent application is hereby incorporated by reference herein and made a part of this specification.

BACKGROUND

Technical Field

The disclosure relates to a light-emitting device, and particularly relates to a micro light-emitting device.

Description of Related Art

Generally, the light-emitting efficiency of the micro light-emitting device is affected by many factors. For example, in micro light-emitting devices, there are often some film layers or elements with larger light absorption ratio. Therefore, when light passes through the film layers or elements, a larger ratio of light is absorbed, which causes light loss, so that the light-emitting efficiency of the micro light-emitting device is significantly reduced. Therefore, how to effectively reduce the light loss and improve the light-emitting efficiency of the micro light-emitting device is a big challenge for persons skilled in the art.

SUMMARY

The disclosure provides a micro light-emitting device, which can effectively reduce light loss and improve the light-emitting efficiency thereof.

A micro light-emitting device of the disclosure includes a first type semiconductor layer, a light-emitting layer, a second type semiconductor layer, a first type electrode, a second type electrode, and a light reflection layer. The light-emitting layer is arranged on the first type semiconductor layer. The second type semiconductor layer is arranged on the light-emitting layer. The first type electrode and the second type electrode are both arranged on the second type semiconductor layer. The light reflection layer is arranged between the light-emitting layer and the first type electrode. The light reflection layer includes an oxidized area and a non-oxidized area. A reflectance of the oxidized area is greater than a reflectance of the non-oxidized area. An orthographic projection of a part of the oxidized area on the first type semiconductor layer and an orthographic projection of the first type electrode on the first type semiconductor layer at least partially overlap.

In an embodiment of the disclosure, the light reflection layer is at least two layers of light reflection layers, and the at least two layers of light reflection layers are arranged between the light-emitting layer and the first type electrode toward a first type semiconductor layer direction.

In an embodiment of the disclosure, a thickness of the light reflection layer is less than or equal to 500 Å.

In an embodiment of the disclosure, an orthographic projection of the non-oxidized area on the first type semiconductor layer and the orthographic projection of the first type electrode on the first type semiconductor layer at least partially overlap.

In an embodiment of the disclosure, a partial overlap area is less than or equal to 70%.

In an embodiment of the disclosure, in an arrangement direction of the first type electrode and the second type electrode, there is a distance greater than or equal to 1 µm between an edge of the non-oxidized area and an edge of the light reflection layer.

In an embodiment of the disclosure, a ratio of a width of the non-oxidized area to a distance between the first type electrode and the second type electrode is greater than or equal to 30%.

In an embodiment of the disclosure, an aluminum content of the light reflection layer is greater than or equal to 80%.

In an embodiment of the disclosure, the oxidized area surrounds the non-oxidized area.

In an embodiment of the disclosure, in an arrangement direction of the first type electrode and the second type electrode, the non-oxidized area extends between the first type electrode and the second type electrode.

In an embodiment of the disclosure, in an arrangement direction of the first type electrode and the second type electrode, the non-oxidized area is retracted between the first type electrode and the second type electrode.

In an embodiment of the disclosure, the micro light-emitting device further includes a conductive layer. The conductive layer is located between the first type electrode and the light reflection layer.

In an embodiment of the disclosure, the micro light-emitting device further includes a dielectric layer. The dielectric layer is arranged on the conductive layer. A reflectance of the dielectric layer is greater than or equal to 80%.

In an embodiment of the disclosure, a resistance value of the oxidized area is greater than a resistance value of the non-oxidized area.

A micro light-emitting device of the disclosure includes a first type semiconductor layer, a light-emitting layer, a second type semiconductor layer, a light reflection layer, a first type electrode, and a second type electrode. The light-emitting layer is arranged on the first type semiconductor layer. The second type semiconductor layer is arranged on the light-emitting layer. The light reflection layer is arranged between the light-emitting layer and the second type semiconductor layer. The light reflection layer includes a high reflection area and a low reflection area. The first type electrode and the second type electrode are both arranged on the light reflection layer. An orthographic projection of a part of the high reflection area on the light-emitting layer and an orthographic projection of the first type electrode on the light-emitting layer at least partially overlap.

In an embodiment of the disclosure, the light reflection layer is at least two layers of light reflection layers, and the at least two layers of light reflection layers are arranged between the first type semiconductor layer and the second type semiconductor layer toward a light-emitting layer direction.

In an embodiment of the disclosure, a resistance value of the high reflection area is greater than a resistance value of the low reflection area.

In an embodiment of the disclosure, a number of layers of the light reflection layer is less than five.

In an embodiment of the disclosure, a distance between the light reflection layer and the first type electrode is between 40 nm and 200 nm.

Based on the above, the light reflection layer including the oxidized area (high reflection area) is inserted between the light-emitting layer and the film layer (such as the semiconductor layer) with a larger light absorption ratio of the micro light-emitting device of the disclosure, and at least a part of the oxidized area (high reflection area) is arranged under an element (such as an electrode), so that a certain ratio of light emitted by the light-emitting layer is reflected by the oxidized area (high reflection area) of the light reflection layer before reaching the film layer (such as the semiconductor layer) and the element (such as the electrode) to reduce the probability of light being absorbed by the film layer (such as the semiconductor layer) and the element (such as the electrode). Therefore, the micro light-emitting device of the disclosure can effectively reduce light loss and improve the light-emitting efficiency thereof.

In order for the features and advantages of the disclosure to be more comprehensible, the following specific embodiments are described in detail in conjunction with the accompanying drawings.

BRIEF DESCRIPTION OF THE DRAWINGS

FIG. 1B is a schematic top view of the micro light-emitting device of FIG. 1A, where FIG. 1A is a partial cross-sectional view along a line A-A' in FIG. 1B.

FIG. 2B is a schematic top view of the micro light-emitting device of FIG. 2A, where FIG. 2A is a partial cross-sectional view along a line B-B' in FIG. 2B.

FIG. 3B is a schematic top view of the micro light-emitting device of FIG. 3A, where FIG. 3A is a partial cross-sectional view along a line C-C' in FIG. 3B.

In particular, for the sake of clarity, FIGS. 1B, 2B, and 3B are shown in perspective.

DETAILED DESCRIPTION OF DISCLOSED EMBODIMENTS

The detailed features and advantages of the disclosure are described in detail in the following embodiments. The content is sufficient for persons skilled in the art to understand the technical content of the disclosure to be implemented accordingly. Also, according to the content, claims, and drawings disclosed in this specification, persons skilled in the art may easily understand the relevant objective and advantages of the disclosure. The following embodiments further illustrate in detail the viewpoint of the disclosure, but do not limit the scope of the disclosure by any viewpoint.

Figure 1A:
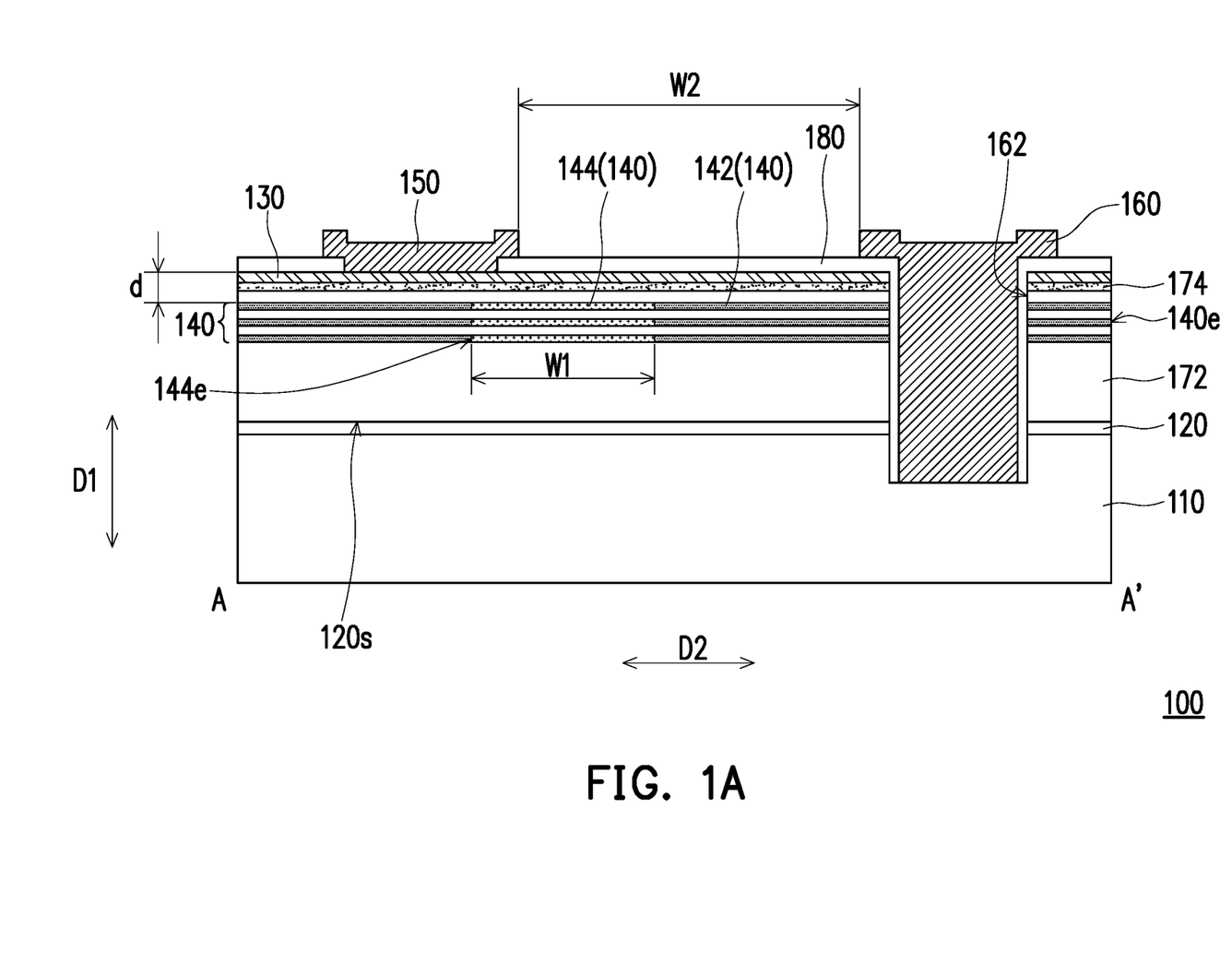
FIG. 1A is a schematic partial cross-sectional view of a micro light-emitting device according to an embodiment of the disclosure.
Figure 1B:
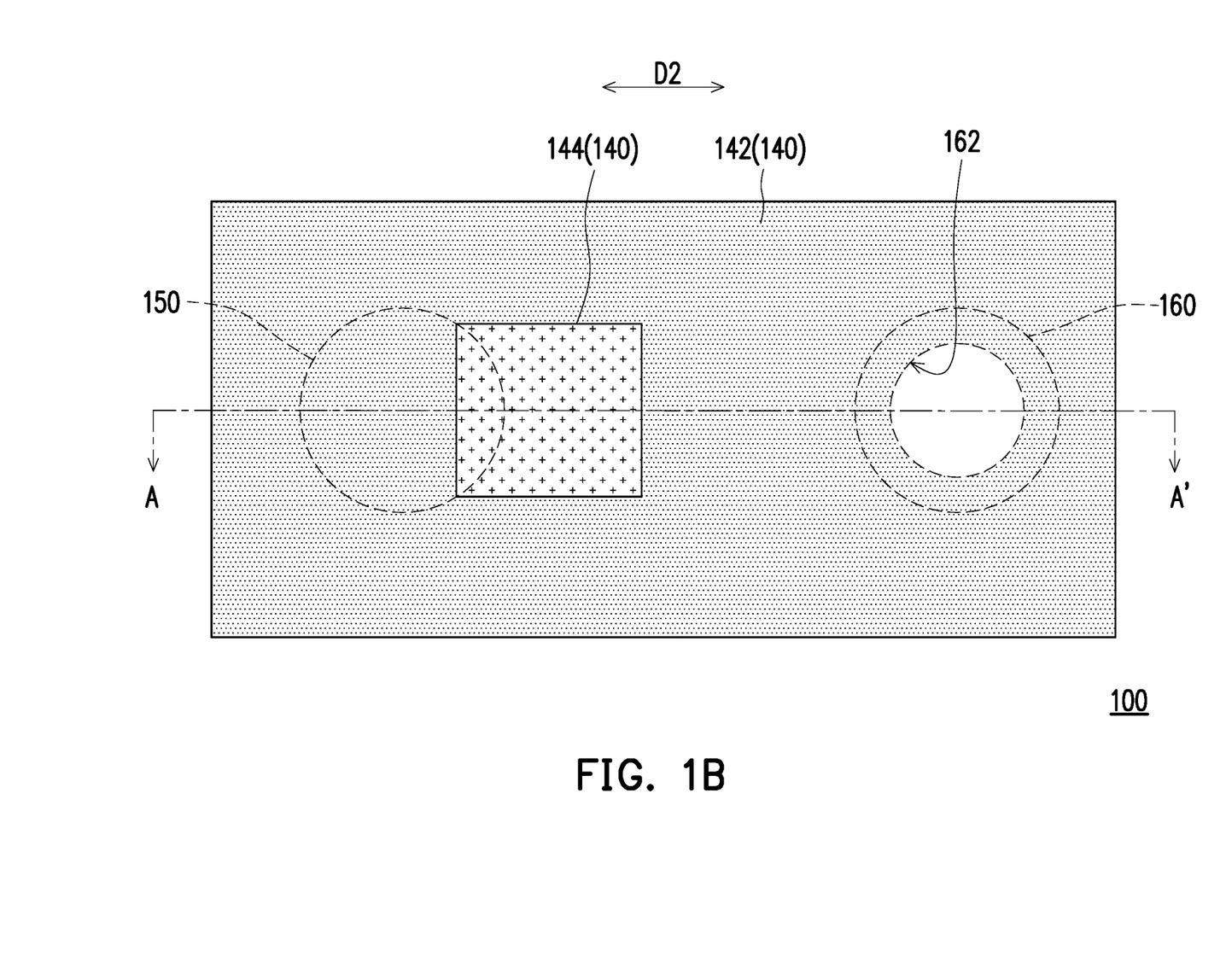

FIG. 1A is a schematic partial cross-sectional view of a micro light-emitting device according to an embodiment of the disclosure. FIG. 1B is a schematic top view of the micro light-emitting device of FIG. 1A, where FIG. 1A is a partial cross-sectional view along a line A-A' in FIG. 1B.

Please refer to FIGS. 1A and 1B. In this embodiment, a micro light-emitting device 100 includes a first type semiconductor layer 110, a light-emitting layer 120, a conductive layer 130, a light reflection layer 140, a first type electrode 150, a second type electrode 160, a second type semiconductor layer 172, and a second type heavily doped semiconductor layer 174.

The light-emitting layer 120 is arranged on the first type semiconductor layer 110. The second type heavily doped semiconductor layer 174 is arranged on the light-emitting layer 120. The first type electrode 150 and the second type electrode 160 are both arranged on the second type heavily doped semiconductor layer 174, and the first type electrode 150 and the second type electrode 160 are electrically connected. The second type electrode 160 may have a through hole 162 extending toward the direction of the first type semiconductor layer 110.

In some embodiments, the first type electrode 130 may be a p-type electrode, and the second type electrode may be an n-type electrode, but the disclosure is not limited thereto.

In this embodiment, the light reflection layer 140 may include areas with different reflectance, so that the light emitted by the light-emitting layer 120 may be effectively reflected by the light reflection layer 140 to reduce the probability of light loss. For example, the light reflection layer 140 may include a high reflection area and a low reflection area, so that the light emitted by the light-emitting layer 120 may be effectively reflected by the high reflection area to reduce the probability of light loss.

Furthermore, the light reflection layer 140 may be formed by selective wet oxidation in a suitable semiconductor material to form an oxidized area 142 with high reflectance and a non-oxidized area 144 with low reflectance. In other words, the reflectance of the oxidized area 142 of the light reflection layer 140 may be greater than the reflectance of the non-oxidized area 144.

In this embodiment, the light reflection layer 140 may be arranged between the light-emitting layer 120 and the first type electrode 150 or the second type heavily doped semiconductor layer 174. In addition, an orthographic projection of a part of the oxidized area 142 (high reflection area) on the first type semiconductor layer 110 or the light-emitting layer 120 and an orthographic projection of the first type electrode 150 on the first type semiconductor layer 110 or the light-emitting layer 120 at least partially overlap. Therefore, the micro light-emitting device 100 inserts the light reflection layer 140 including the oxidized area 142 (high reflection area) between the light-emitting layer 120 and a film layer (such as the conductive layer 130 or the second type heavily doped semiconductor layer 174) with a larger light absorption ratio, and at least a part of the oxidized area 142 (high reflection area) is arranged under an element (such as the first type electrode 150), so that a certain proportion of the light emitted by the light-emitting layer 120 is reflected by the oxidized area 142 (high reflection area) of the light reflection layer 140 toward a light-emitting surface 120s before reaching the film layer (such as the conductive layer 130 or the second type heavily doped semiconductor layer 174) and the element (such as the electrode 150) to reduce the probability of light being absorbed by the film layer (such as the conductive layer 130 or the second type heavily doped semiconductor layer 174) and the element (such as the first type electrode 150). Therefore, the micro light-emitting device 100 can effectively reduce light loss and improve the light-emitting efficiency thereof.

In some embodiments, the light reflection layer 140 may have at least two layers (three layers are schematically shown in FIG. 1A), and the at least two layers of light reflection layers 140 may be arranged between the light-emitting layer 120 and the conductive layer 130 or the second type heavily doped semiconductor layer 174 toward a direction D1 of the first type semiconductor layer 110 or the light-emitting layer 120. The reflectance of the light reflection layer 140 with only one layer is less than the reflectance of the light reflection layer 140 with at least two layers. At this time, there is preferably a distance between any two adjacent light reflection layers 140. In other words, a part of the second type semiconductor layer 172 may be interlaced between any two adjacent light reflection layers 140. Therefore, the light reflection layer 140 may have the function of a distributed Bragg reflector (DBR). Through the design of the distributed Bragg reflector, the light reflection of the light reflection layer 140 may be significantly improved, and arranging the second type semiconductor layer 172 between any two adjacent light reflection layers 140 may also increase the current transfer efficiency, but the invention is not limited thereto. In an embodiment not shown, the arrangement between any two adjacent light reflection layers 140 may also be close to increase light reflection. Furthermore, toward the direction D1 of the first type semiconductor layer 110 or the light-emitting layer 120, the second type heavily doped semiconductor layer 174, a part of the second type semiconductor layer 172, a light reflection layer 140, another part of the second type semiconductor layer 172, another light reflection layer 140, still another part of the second type semiconductor layer 172, and still another light reflection layer 140 may be closely arranged to increase light reflection.

In some embodiments, when the number of layers of the light reflection layer is too many, the problem of excess voltage may occur. Therefore, the number of layers of the light reflection layer 140 is less than five layers, and may be between three to four layers, so that the light reflection layer 140 may achieve better reflectance. For example, when the number of layers of the light reflection layer 140 is four layers and the color of emitted light is in the 450 nm waveband, the reflectance may reach more than 90%, but the disclosure is not limited thereto.

In some embodiments, the thickness of each layer in multiple layers of the light reflection layers 140 may be substantially the same, but the disclosure is not limited thereto. The thickness of each layer in the multiple layers of the light reflection layers 140 may be adjusted according to actual design requirements.

In some embodiments, the thickness of the light reflection layer 120 may be less than or equal to 500 Å. It is difficult to control the oxidation depth when the thickness exceeds 500 Å with the size of the micro light-emitting device 100 less than or equal to 50 μm.

In some embodiments, the light-emitting layer 120 is, for example, a multiple quantum well (MQW). The MQW includes alternately stacked multiple layers of indium gallium nitride (InGaN) and multiple layers of gallium nitride (GaN). The light-emitting wavelength range of the light-emitting layer 150 may be adjusted by designing the ratio of indium or gallium in the light-emitting layer 150, but the disclosure is not limited thereto.

In some embodiments, the first type semiconductor layer 110 is, for example, a p-type semiconductor layer, such as p-GaN, and the second type semiconductor layers 172 and the second type heavily doped semiconductor layer 174 are, for example, n-type semiconductor layers, such as n-GaN, but the disclosure is not limited thereto, and the same may be adjusted according to actual design requirements.

In some embodiments, the conductive layer 130 may be indium tin oxide (ITO). Since ITO has a larger light absorption ratio, by arranging the oxidized area 142 (high reflection area) between the light-emitting layer 120 and the conductive layer 130 (ITO), light may be reflected before being significantly absorbed by the conductive layer 130 (ITO) to more effectively reduce light loss. Therefore, the light-emitting efficiency of the micro light-emitting device 100 may be further effectively improved, but the disclosure is not limited thereto.

In some embodiments, the second type heavily doped semiconductor layer 174 may be P+-GaN. Since dopants in a second type heavily doped semiconductor layer have a larger light absorption ratio, by arranging the oxidized area 142 (high reflection area) between the light-emitting layer 120 and the second type heavily doped semiconductor layer 174, light may be reflected before being significantly absorbed by the second type heavily doped semiconductor layer 174 to more effectively reduce light loss. Therefore, the light-emitting efficiency of the micro light-emitting device 100 may be further effectively improved, but the disclosure is not limited thereto.

In some embodiments, the conductive layer 130 may be arranged on the second type heavily doped semiconductor layer 174 and cover the second type heavily doped semiconductor layer 174. For example, the conductive layer 130 may cover the second type heavily doped semiconductor layer 174 and directly contact the second type heavily doped semiconductor layer 174, but the disclosure is not limited thereto.

In some embodiments, the light reflection layer 140 may be a film layer with a certain amount of aluminum content to effectively perform selective wet oxidation thereon, so as to form the oxidized area 142 including aluminum oxide ($AlO_2$) and the non-oxidized area 144 not including $AlO_2$, but the disclosure is not limited thereto.

In some embodiments, the second type semiconductor layer 172 and the second type heavily doped semiconductor layer 174 may be III-V semiconductor layers, such as GaN layers, and the light reflection layer 140 may be semiconductor layers such as an aluminum indium nitride ($Al_xIn_{1-x}N$) layers with a certain amount of aluminum content, where $0.8 \leq x \leq 1$, and when the value of x is too small, light will be absorbed, but the disclosure is not limited thereto. It is specifically stated that the micro light-emitting device 100 at this time is, for example, a blue-green light micro light-emitting diode. Therefore, the light reflection layer 140 may be epitaxially grown together with the second type semiconductor layer 172, the light-emitting layer 120 and the first type semiconductor layer 110 during the epitaxial process, instead of forming the light reflection layer 140 in a subsequent photographic process, whereby the subsequent yield of the micro light-emitting device 100 increase.

In some embodiments, the second type semiconductor layer 172 and the second type heavily doped semiconductor layer 174 may be a semiconductor layer such as aluminum gallium indium phosphide (AlGaInP) layers, and the light reflection layer 140 may be an aluminum gallium arsenide ($Al_yGa_{1-y}As$) layer with a certain amount of aluminum content, where $0.9 \leq y \leq 1$, and when the value of y is too small, light will be absorbed, but the disclosure is not limited thereto. It is particularly stated that the micro light-emitting device 100 at this time is, for example, a red light micro light-emitting diode. Therefore, the light reflection layer 140 may be epitaxially grown together with the second type semiconductor layer 172, the light-emitting layer 120 and the first type semiconductor layer 110 during the epitaxial process, instead of forming the light reflection layer 140 in a subsequent photographic process, whereby the subsequent yield of the micro light-emitting device 100 increase.

In some embodiments, the non-oxidized area 144 and the first type electrode 150 may have a coverage. The coverage rate may be the area where the orthographic projection of the non-oxidized area 144 on the first type semiconductor layer 110 and the orthographic projection of the first type electrode 150 on the first type semiconductor layer 110 partially overlap. For example, the coverage rate (partial overlap area) may be less than or equal to 70%. If the coverage rate is too large, the light reflection effect is poor, but the disclosure is not limited thereto.

In some embodiments, the orthographic projection of the non-oxidized area 144 on the first type semiconductor layer 110 and the orthographic projection of the first type electrode 150 on the first type semiconductor layer 110 may at least partially overlap, but the disclosure is not limited thereto.

In some embodiments, the ratio of an orthographic projection area of the non-oxidized area 144 on the first type semiconductor layer 110 to an orthographic projection area of the micro light-emitting device 100 on the first type semiconductor layer 110 may be between 20% and 80%. If the ratio is too small, the light reflection effect is poor, and if the ratio is too large, the forward voltage will be too high.

In some embodiments, the orthographic projection of the non-oxidized area 144 on the first type semiconductor layer 110 may not overlap with the orthographic projection of the second type electrode 160 on the first type semiconductor layer 110, so that the current flowing through the non-oxidized area 144 will not be too close to cause the problem of defect recombination, but the disclosure is not limited thereto.

In some embodiments, in an arrangement direction D2 of the first type electrode 150 and the second type electrode 160, there may be a distance greater than or equal to 1 µm between an edge 144e of the non-oxidized area 144 and an edge 140e of the light reflection layer 140. If the distance is too small, the light reflection effect is poor, but the disclosure is not limited thereto.

In some embodiments, the ratio of a width W1 of the non-oxidized area 144 to a distance W2 between the first type electrode 150 and the second type electrode 160 may be greater than or equal to 30%. If the ratio is too small, the light reflection effect is poor, but the disclosure is not limited thereto.

In some embodiments, a shortest distance d between the light reflection layer 140 and the first type electrode 150 may be between 40 nm and 200 nm, but the disclosure is not limited thereto. If the distance is too large, the second type heavily doped semiconductor layer 174 absorbs light.

In some embodiments, the micro light-emitting device 100 may be a micro light-emitting device, such as a micro light-emitting diode (micro LED), and the size of the micro light-emitting device may be less than or equal to 50 µm, but the disclosure is not limited thereto.

In some embodiments, when the current range of the micro light-emitting device is below 10 mA, for example, between 0.1 mA and 10 mA, the micro light-emitting device may have better light-emitting efficiency, but the disclosure is not limited thereto.

In some embodiments, the micro LED may be a horizontal type micro LED, but the disclosure is not limited thereto.

It should be noted that the disclosure does not limit the type of the micro light-emitting device 100. For example, the micro light-emitting device 100 may also be a micro light-emitting device such as a micro laser diode (micro LD).

In some embodiments, the oxidized area 142 may surround the non-oxidized area 144. In other words, the oxidized area 142 may be only located at the edge of the micro light-emitting device 100, so that light can be concentrated at the center of the micro light-emitting device 100 to be emitted, but the disclosure is not limited thereto.

In some embodiments, the micro light-emitting device 100 may further include a passivation layer 180. The passivation layer 180 may be arranged on the conductive layer 130 and may extend into the through hole 162 to improve the electrical performance of the micro light-emitting device 100, but the disclosure is not limited thereto.

In some embodiments, the resistance value of the oxidized area 142 (high reflection area) may be greater than the resistance value of the non-oxidized area 144 (low reflection area), so the light reflection layer 140 may also have the function of controlling the direction of current flow. Furthermore, the direction of current flow may be effectively controlled by the difference in resistance values between the oxidized area 142 (high reflection area) and the non-oxidized area 144 (low reflection area), so that it is difficult for current carriers to laterally diffuse between the electrodes, thereby reducing the probability of current carriers passing through a surface defect part between the electrodes. Therefore, the micro light-emitting device 100 may reduce the probability of a surface recombination phenomenon produced by the current carriers and surface defects while reducing the generation of excess waste heat to improve negative impacts on the performance of the micro light-emitting device 100 due to the presence of the surface defects, but the disclosure is not limited thereto.

It must be noted here that the following embodiments continue to use the reference numerals and some content of the foregoing embodiment. The same or similar reference numerals are used to represent the same or similar elements, and the description of the same technical content is omitted. Reference may be made to the foregoing embodiment for the description of the omission, which will not be repeated the following embodiments.

Figure 2A:
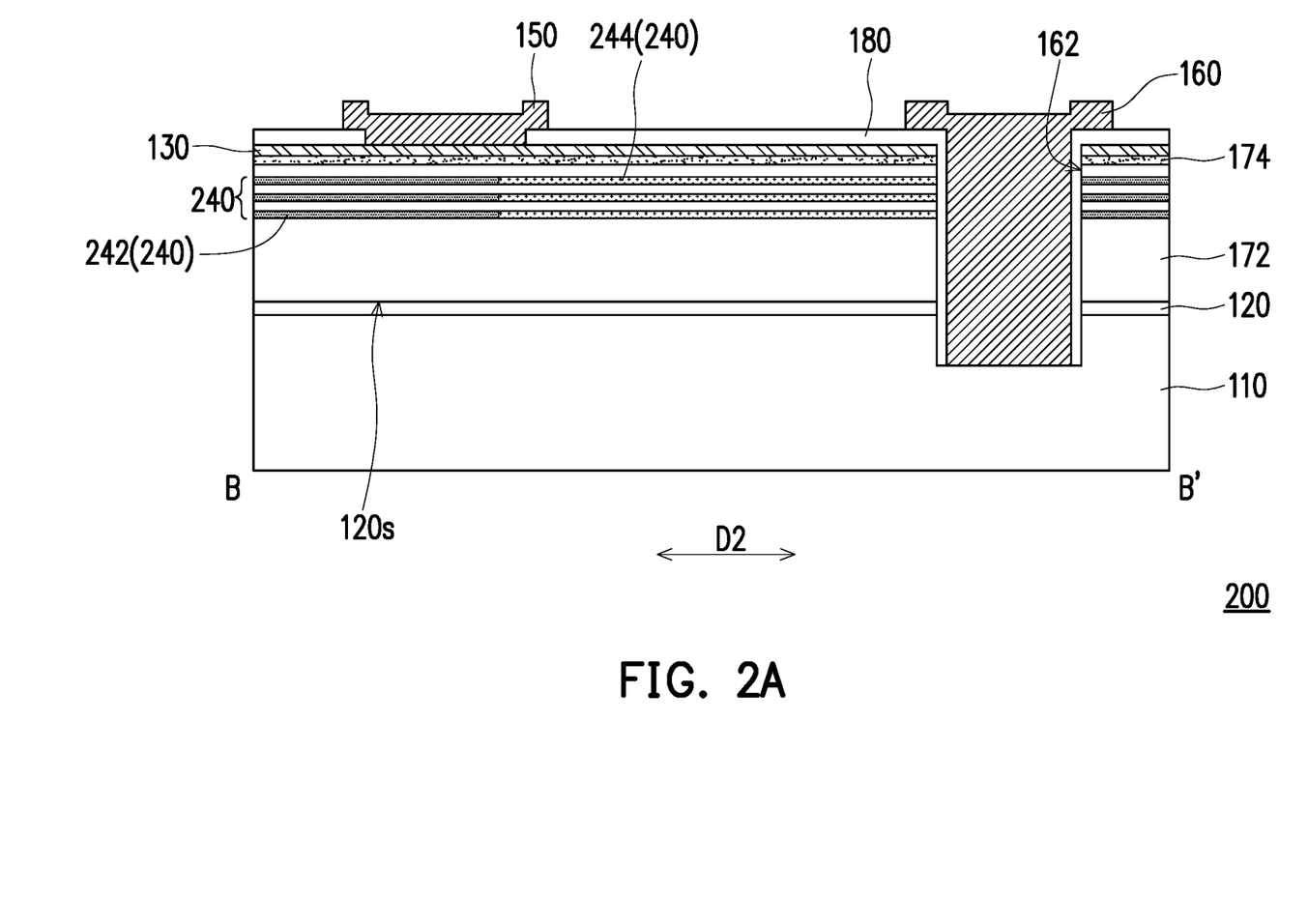
FIG. 2A is a schematic partial cross-sectional view of a micro light-emitting device according to another embodiment of the disclosure.
Figure 2B:
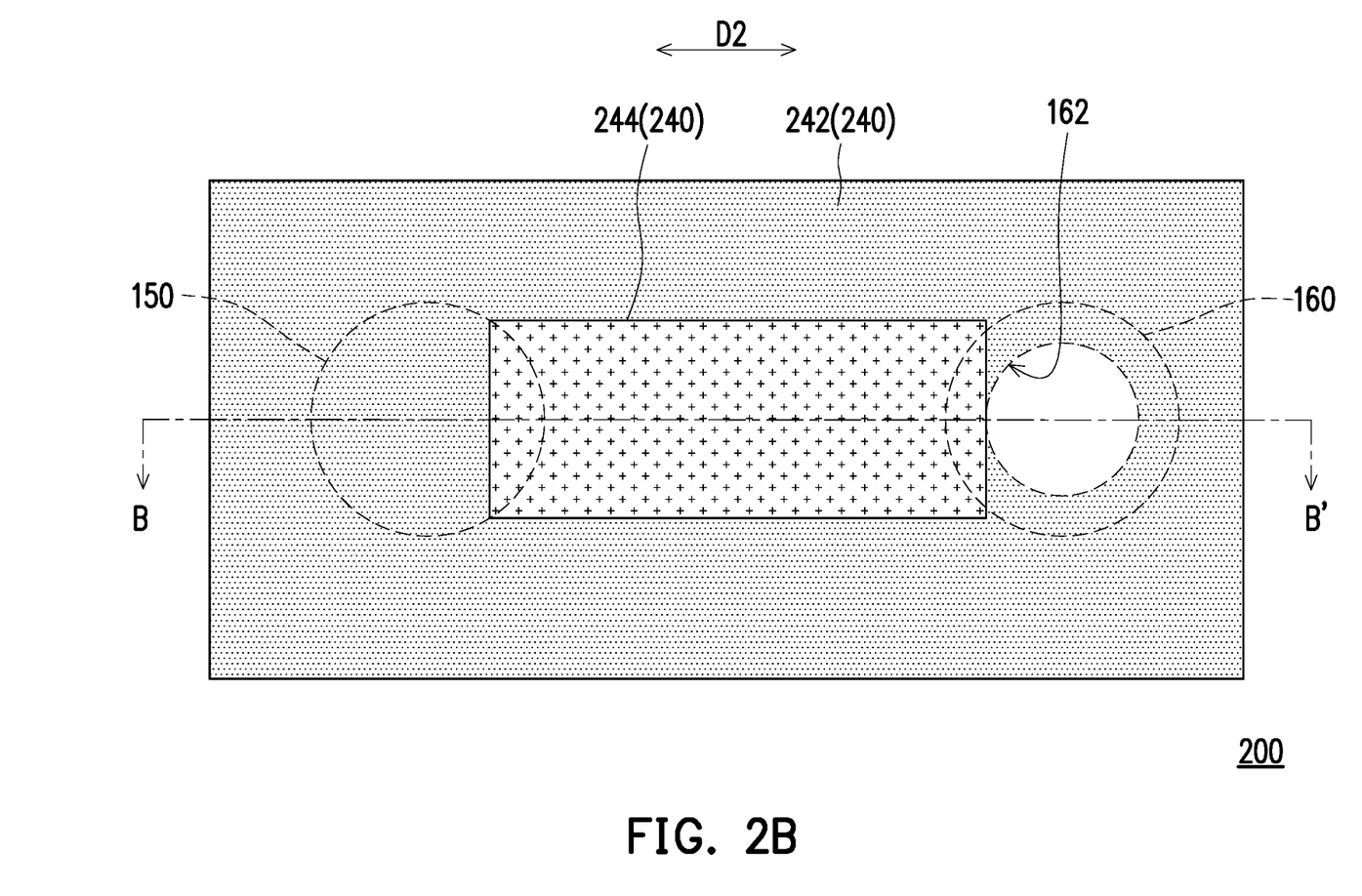

FIG. 2A is a schematic partial cross-sectional view of a micro light-emitting device according to another embodiment of the disclosure. FIG. 2B is a schematic top view of the micro light-emitting device of FIG. 2A, where FIG. 2A is a partial cross-sectional view along a line B-B' in FIG. 2B. Please refer to FIGS. 2A and 2B. Compared with the micro light-emitting device 100, an oxidized area 242 and a non-oxidized area 244 of a light reflection layer 240 of a micro light-emitting device 200 of this embodiment may have other forms of configuration. Furthermore, the non-oxidized area 244 of the micro light-emitting device 200 of this embodiment may extend between the first type electrode 150 and the second type electrode 160 in the arrangement direction D2 of the first type electrode 150 and the second type electrode 160.

In some embodiments, the non-oxidized area 244 may partially overlap with the first type electrode 150 and the second type electrode 160, that is, at least a part of the non-oxidized area 244 may be located under the first type electrode 150 and the second type electrode 160, but the disclosure is not limited thereto.

Figure 3A:
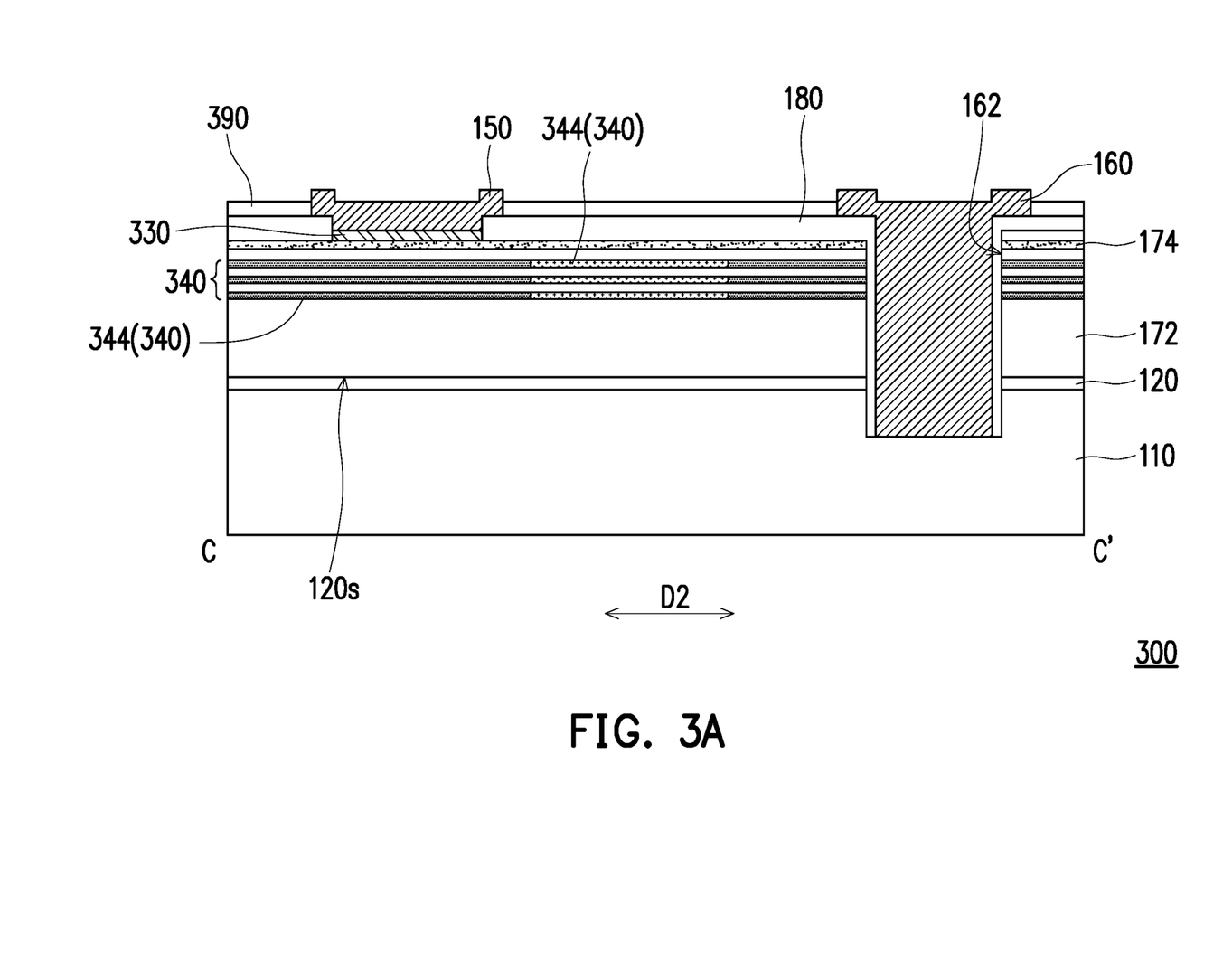
FIG. 3A is a schematic partial cross-sectional view of a micro light-emitting device according to another embodiment of the disclosure.
Figure 3B:
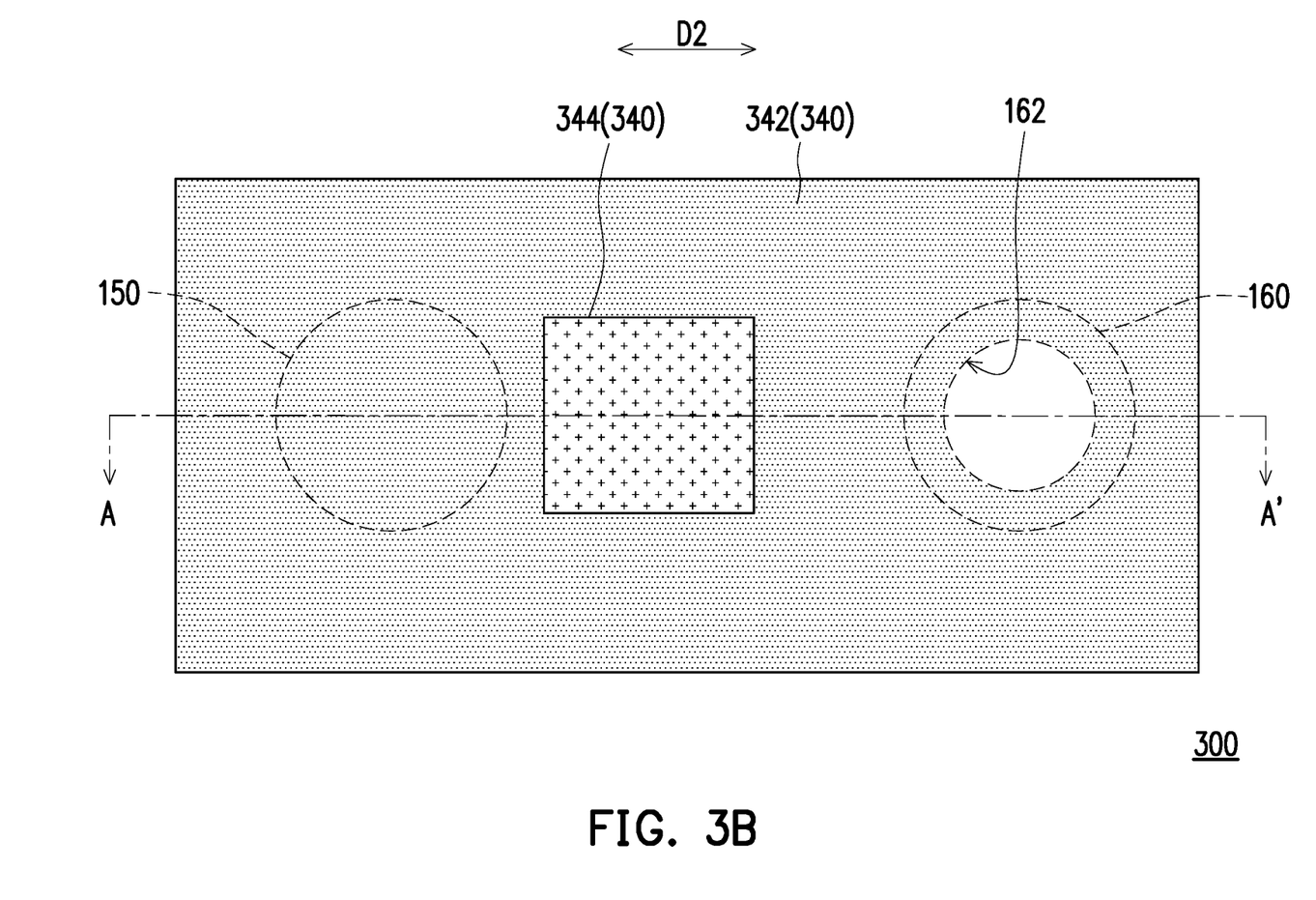

FIG. 3A is a schematic partial cross-sectional view of a micro light-emitting device according to another embodiment of the disclosure. FIG. 3B is a schematic top view of the micro light-emitting device of FIG. 3A, where FIG. 3A is a partial cross-sectional view along a line C-C' in FIG. 3B. Please refer to FIGS. 3A and 3B. Compared to the micro light-emitting device 100, an oxidized area 342, a non-oxidized area 344, and a conductive layer 330 of a light reflection layer 340 of a micro light-emitting device 300 of this embodiment may have other forms of configuration. In addition, the micro light-emitting device 300 may further include a dielectric layer 390.

Furthermore, the non-oxidized area 344 of the micro light-emitting device 300 of this embodiment may be indented between the first type electrode 150 and the second type electrode 160 in the arrangement direction D2 of the first type electrode 150 and the second type electrode 160. In addition, the conductive layer 330 may be located only between the first type electrode 150 and the light reflection layer 340 to reduce the light absorption ratio of the conductive layer 330 and increase the light-emitting efficiency of the micro light-emitting device 300, but the disclosure is not limited thereto.

On the other hand, the dielectric layer 390 may be arranged on the conductive layer 330. The dielectric layer 390 may have a reflectance greater than or equal to 80% to further increase the reflectance and increase the light-emitting efficiency of the micro light-emitting device 300, but the disclosure is not limited thereto.

In some embodiments, the non-oxidized area 344 may not overlap with the first type electrode 150 and the second type electrode 160, that is, the non-oxidized area 344 is not located under the first type electrode 150 and the second type electrode 160. In other words, only the oxidized area 242 is located under the first type electrode 150 and the second type electrode 160. Light is reflected and concentrated at the position of the non-oxidized area 344 to be emitted and the current concentration density is increased through the configuration of the non-oxidized area 344 and the oxidized area 242. Preferably, the orthographic projection of the non-oxidized area 344 on the light-emitting layer 120 may be located on the geometric center of the light-emitting layer 120, but the disclosure is not limited thereto.

It should be noted that the oxidized area and non-oxidized area of the disclosure are not limited to the configuration and corresponding ratio in the foregoing embodiment, as long as the light reflection layer including the oxidized area (high reflection area) is inserted between the light-emitting layer and the film layer (such as the conductive layer or the semiconductor layer) with a larger light absorption ratio, and at least a part of the oxidized area (high reflection area) is arranged under the element (such as the electrode), the same belongs to the protection scope of the disclosure.

In summary, the light reflection layer including the oxidized area (high reflection area) is inserted between the light-emitting layer and the film layer (such as the semiconductor layer) with a larger light absorption ratio of the micro light-emitting device of the disclosure, and at least a part of the oxidized area (high reflection area) is arranged under the element (such as the electrode), so that a certain ratio of light emitted by the light-emitting layer is reflected by the oxidized area (high reflection area) of the light reflection layer before reaching the film layer (such as the semiconductor layer) and the element (such as the electrode) to reduce the probability of light being absorbed by the film layer (such as the semiconductor layer) and the element (such as the electrode). Therefore, the micro light-emitting device of the disclosure can effectively reduce light loss and improve the light-emitting efficiency thereof. In addition, by the difference in resistance values between the oxidized area and the non-oxidized area, the probability of a surface recombination phenomenon produced by the current carriers and surface defects may be reduced while reducing the generation of excess waste heat to improve negative impacts on the performance of the micro light-emitting device due to the presence of the surface defects.

Although the disclosure has been disclosed in the foregoing embodiments, the embodiments are not intended to limit the disclosure. Persons skilled in the art may make some changes and modifications without departing from the spirit and scope of the disclosure. Therefore, the protection scope of the disclosure shall be determined by the scope of the appended claims.

What is claimed is:

1. A micro light-emitting device, comprising:
   a first type semiconductor layer;
   a light-emitting layer, arranged on the first type semiconductor layer;
   a second type semiconductor layer, arranged on the light-emitting layer;
   a second type heavily doped semiconductor layer arranged on the light-emitting layer;
   a first type electrode and a second type electrode, both arranged on the second type heavily doped semiconductor layer; and
   a light reflection layer, arranged between the light-emitting layer and the second type heavily doped semiconductor layer, wherein the light reflection layer comprises an oxidized area and a non-oxidized area, and a reflectance of the oxidized area is greater than a reflectance of the non-oxidized area, wherein
   an orthographic projection of a part of the oxidized area on the first type semiconductor layer and an orthographic projection of the first type electrode on the first type semiconductor layer at least partially overlap, and
   the second type heavily doped semiconductor layer has a larger light absorption ratio than the second type semiconductor layer.

2. The micro light-emitting device according to claim 1, wherein the light reflection layer is at least two layers of light reflection layers, and the at least two layers of light reflection layers are arranged between the light-emitting layer and the first type electrode in toward a first type semiconductor layer direction.

3. The micro light-emitting device according to claim 1, wherein a thickness of the light reflection layer is less than or equal to 500 Å.

4. The micro light-emitting device according to claim 1, wherein an orthographic projection of the non-oxidized area on the first type semiconductor layer and the orthographic projection of the first type electrode on the first type semiconductor layer at least partially overlap to form a partial overlap area.

5. The micro light-emitting device according to claim 4, wherein a ratio of the partial overlap area to the first type electrode is less than or equal to 70%.

6. The micro light-emitting device according to claim 1, wherein in an arrangement direction of the first type electrode and the second type electrode, a distance greater than or equal to 1 µm between an edge of the non-oxidized area and an edge of the light reflection layer.

7. The micro light-emitting device according to claim 1, wherein a ratio of a width of the non-oxidized area to a distance between the first type electrode and the second type electrode is greater than or equal to 30%.

8. The micro light-emitting device according to claim 1, wherein an aluminum content of the light reflection layer is greater than or equal to 80%.

9. The micro light-emitting device according to claim 1, wherein the oxidized area surrounds the non-oxidized area.

10. The micro light-emitting device according to claim 1, wherein in an arrangement direction of the first type electrode and the second type electrode, the non-oxidized area is indented between the first type electrode and the second type electrode.

11. The micro light-emitting device according to claim 1, further comprising a conductive layer, wherein the conductive layer is located between the first type electrode and the light reflection layer.

12. The micro light-emitting device according to claim 11, further comprising a dielectric layer, arranged on the conductive layer, wherein a reflectance of the dielectric layer is greater than or equal to 80%.

13. The micro light-emitting device according to claim 1, wherein a resistance value of the oxidized area is greater than a resistance value of the non-oxidized area.

14. The micro light-emitting device according to claim 1, wherein a ratio of an orthographic projection area of the non-oxidized area on the first type semiconductor layer to the first type semiconductor layer is between 20% and 80%.

15. A micro light-emitting device, comprising:
a first type semiconductor layer;
a light-emitting layer, arranged on the first type semiconductor layer;
a second type semiconductor layer, arranged on the light-emitting layer;
a second type heavily doped semiconductor layer arranged on the light-emitting layer;
a light reflection layer, arranged between the light-emitting layer and the second type heavily doped semiconductor layer, wherein the light reflection layer comprises a high reflection area and a low reflection area; and
a first type electrode and a second type electrode, both arranged on the light reflection layer, wherein an orthographic projection of a part of the high reflection area on the light-emitting layer and an orthographic projection of the first type electrode on the light-emitting layer at least partially overlap, and
the second type heavily doped semiconductor layer has a larger light absorption ratio than the second type semiconductor layer.

16. The micro light-emitting device according to claim 15, wherein the light reflection layer is at least two layers of light reflection layers and the at least two layers of light reflection layers are arranged in the second type semiconductor layer and between the second type heavily doped semiconductor layer and the light-emitting layer.

17. The micro light-emitting device according to claim 15, wherein a resistance value of the high reflection area is greater than a resistance value of the low reflection area.

18. The micro light-emitting device according to claim 1 or claim 15, wherein the light reflection layer is at least two layers of light reflection layers, and a number of layers of the at least two layers of light reflection layers is less than five.

19. The micro light-emitting device according to claim 1 or claim 15, wherein a distance between the light reflection layer and the first type electrode is between 40 nm and 200 nm.

* * * * *